(12) United States Patent
Shibata et al.

(10) Patent No.: US 10,811,834 B2
(45) Date of Patent: Oct. 20, 2020

(54) LASER BEAM GENERATION APPARATUS, LASER MACHINING DEVICE, AND LASER MACHINING METHOD

(71) Applicant: RICOH COMPANY, LTD., Tokyo (JP)

(72) Inventors: Shinsuke Shibata, Kanagawa (JP); Yasuhiro Higashi, Miyagi (JP); Yoshio Wada, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 106 days.

(21) Appl. No.: 15/770,999

(22) PCT Filed: Nov. 16, 2016

(86) PCT No.: PCT/JP2016/083987
§ 371 (c)(1),
(2) Date: Apr. 25, 2018

(87) PCT Pub. No.: WO2017/090497
PCT Pub. Date: Jun. 1, 2017

(65) Prior Publication Data
US 2018/0323569 A1 Nov. 8, 2018

(30) Foreign Application Priority Data

Nov. 24, 2015 (JP) ................................. 2015-229113
Sep. 16, 2016 (JP) ................................. 2016-181687

(51) Int. Cl.
*B23K 26/06* (2014.01)
*H01S 3/00* (2006.01)
(Continued)

(52) U.S. Cl.
CPC .......... *H01S 3/0057* (2013.01); *B23K 26/064* (2015.10); *G02B 6/42* (2013.01);
(Continued)

(58) Field of Classification Search
CPC ... B23K 26/064; H01S 3/1301; H01S 3/0057; H01S 3/1001; H01S 3/06758; H01S 3/2375; H01S 5/4012; H01S 5/423
See application file for complete search history.

(56) References Cited

U.S. PATENT DOCUMENTS 6,151,338 A 11/2000 Grubb et al.
6,275,250 B1 8/2001 Sanders et al.
(Continued)

FOREIGN PATENT DOCUMENTS

JP 5-8071 A 1/1993
JP 7-164178 A 6/1995
(Continued)

OTHER PUBLICATIONS

Machine Translation—JP2008/124358—performed Jan. 2020 (Year: 2008).*
(Continued)

*Primary Examiner* — Brian W Jennison
(74) *Attorney, Agent, or Firm* — Xsensus LLP

(57) ABSTRACT

A laser beam generation apparatus includes a light source section including a plurality of seed lasers each emitting laser light, an optical amplification section disposed to face the seed lasers of the light source section and configured to amplify the laser light emitted from the seed lasers and received at an incidence surface to output the amplified laser light from an emission surface, and a plurality of light-guiding paths configured to guide the laser light emitted by the seed lasers to enter the incidence surface of the optical amplification section, wherein at least one of the plurality of light-guiding paths has an optical distance different from optical distances of other light-guiding paths, wherein the optical amplification section is configured to combine the
(Continued)

laser light from the plurality of light-guiding paths and output the combined laser light as a laser beam.

8 Claims, 16 Drawing Sheets

(51) Int. Cl.
*G02B 6/42* (2006.01)
*B23K 26/064* (2014.01)
*H01S 3/23* (2006.01)
*H01S 5/40* (2006.01)
*H01S 5/42* (2006.01)
*H01S 3/067* (2006.01)
*H01S 3/10* (2006.01)

(52) U.S. Cl.
CPC ......... *H01S 3/06758* (2013.01); *H01S 3/1001* (2019.08); *H01S 3/2375* (2013.01); *H01S 5/4012* (2013.01); *H01S 5/423* (2013.01)

(56) References Cited

U.S. PATENT DOCUMENTS

| | | |
|---|---|---|
| 6,335,941 B1 | 1/2002 | Grubb et al. |
| 6,347,007 B1 | 2/2002 | Grubb et al. |
| 6,433,306 B1 | 8/2002 | Grubb et al. |
| 8,502,852 B2 | 8/2013 | Numata et al. |
| 8,693,514 B2 | 4/2014 | Tamaoki |
| 8,879,600 B2 | 11/2014 | Hanaoka et al. |
| 8,937,982 B2 | 1/2015 | Higashi et al. |
| 2009/0141751 A1* | 6/2009 | Kakui .................. H01S 3/2308 372/25 |
| 2012/0134670 A1* | 5/2012 | Hamada ............... H04B 10/504 398/43 |
| 2012/0300288 A1 | 11/2012 | Ogaki |
| 2013/0034115 A1 | 2/2013 | Prawiharjo et al. |
| 2013/0064257 A1 | 3/2013 | Kakui |
| 2014/0050238 A1 | 2/2014 | Kakui |
| 2014/0247841 A1 | 9/2014 | Seurin et al. |
| 2015/0273624 A1 | 10/2015 | Yoshida |
| 2016/0094003 A1 | 3/2016 | Numata et al. |
| 2016/0094006 A1 | 3/2016 | Hagita et al. |
| 2016/0094009 A1 | 3/2016 | Izumiya et al. |

FOREIGN PATENT DOCUMENTS

| | | |
|---|---|---|
| JP | 2008-124358 A | 5/2008 |
| JP | 2010-80642 A | 4/2010 |
| JP | 2014-53500 A | 3/2014 |
| JP | 5595740 B2 | 9/2014 |
| JP | 2014-224917 A | 12/2014 |
| JP | 5654649 B2 | 1/2015 |
| JP | 5713541 B2 | 5/2015 |
| JP | 2017-98531 A | 6/2017 |
| WO | WO 2016/199903 A1 | 12/2016 |
| WO | WO 2017/081858 A1 | 5/2017 |

OTHER PUBLICATIONS

Machine Translation—JP2014/224917—performed Jan. 2020 (Year: 2014).*

Office Action issued in U.S. Appl. No. 15/773,763 dated Aug. 7, 2019.

International Search Report and Written Opinion dated Jan. 24, 2017 in PCT/JP2016/004813 filed on Nov. 4, 2016.

International Search Report and Written Opinion dated Jan. 24, 2017 in PCT/JP2016/083987 filed on Nov. 16, 2016.

Office Action dated May 27, 2020, issued in corresponding U.S. Appl. No. 15/773,763, 20 pages.

* cited by examiner

[Fig. 1]
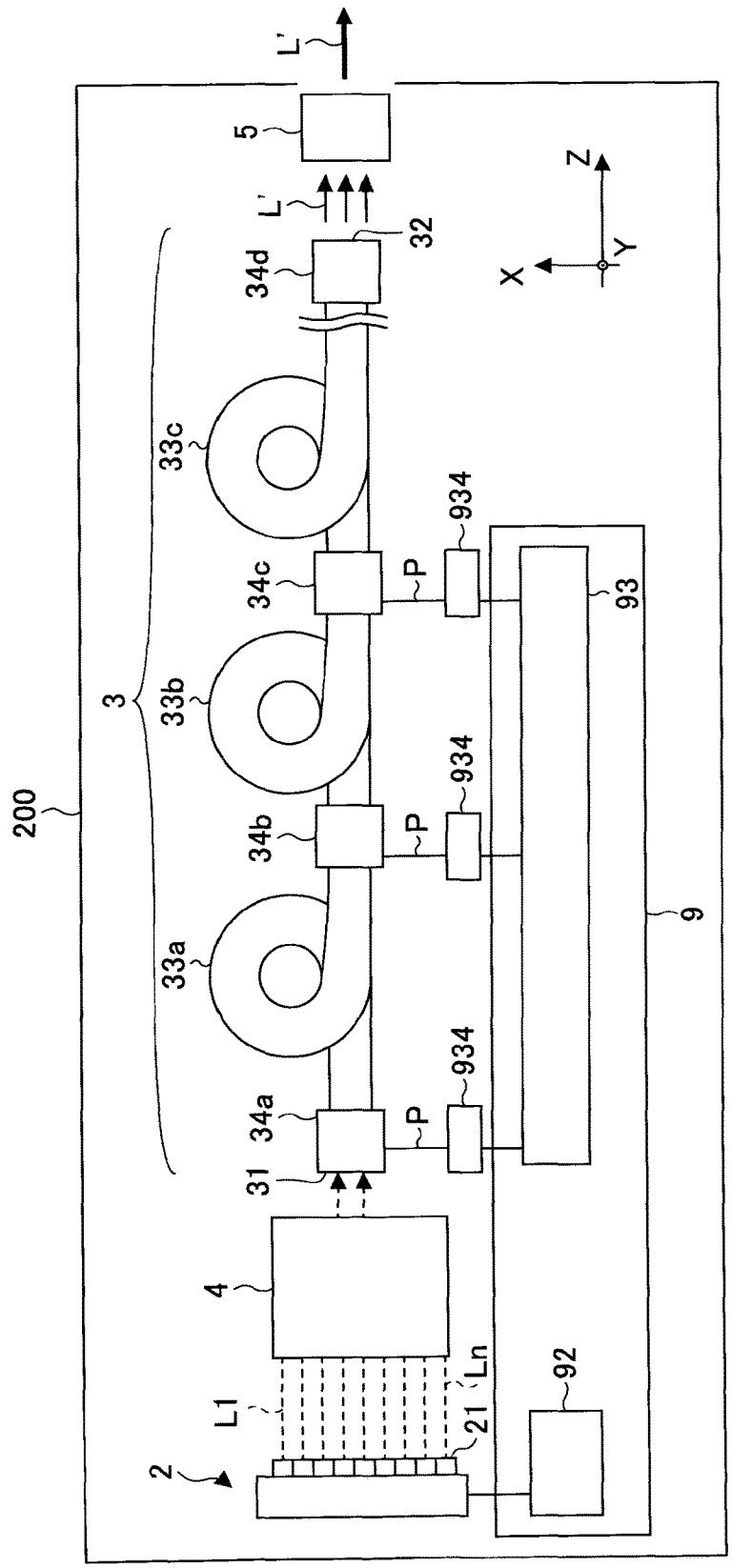

[Fig. 2]
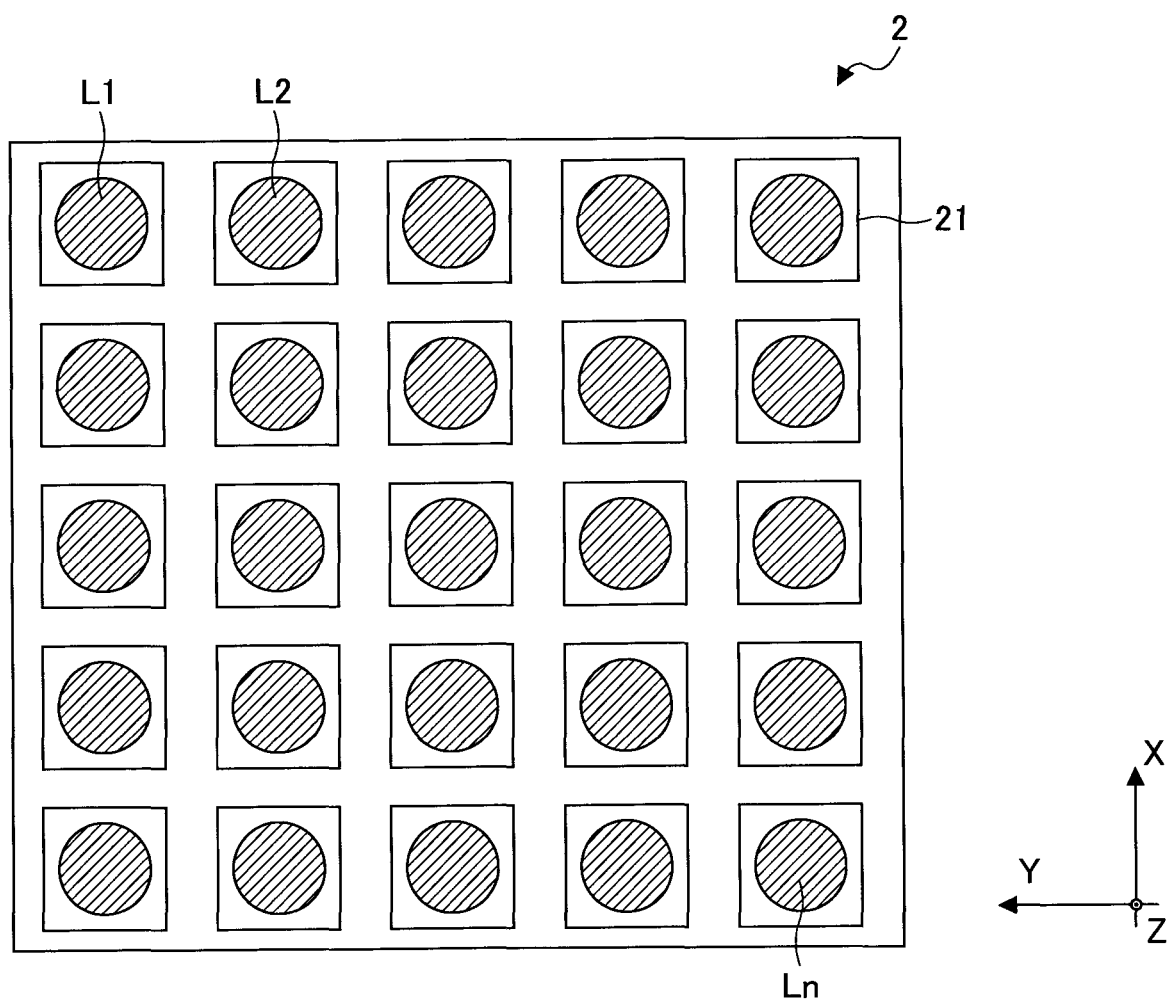

[Fig. 3]
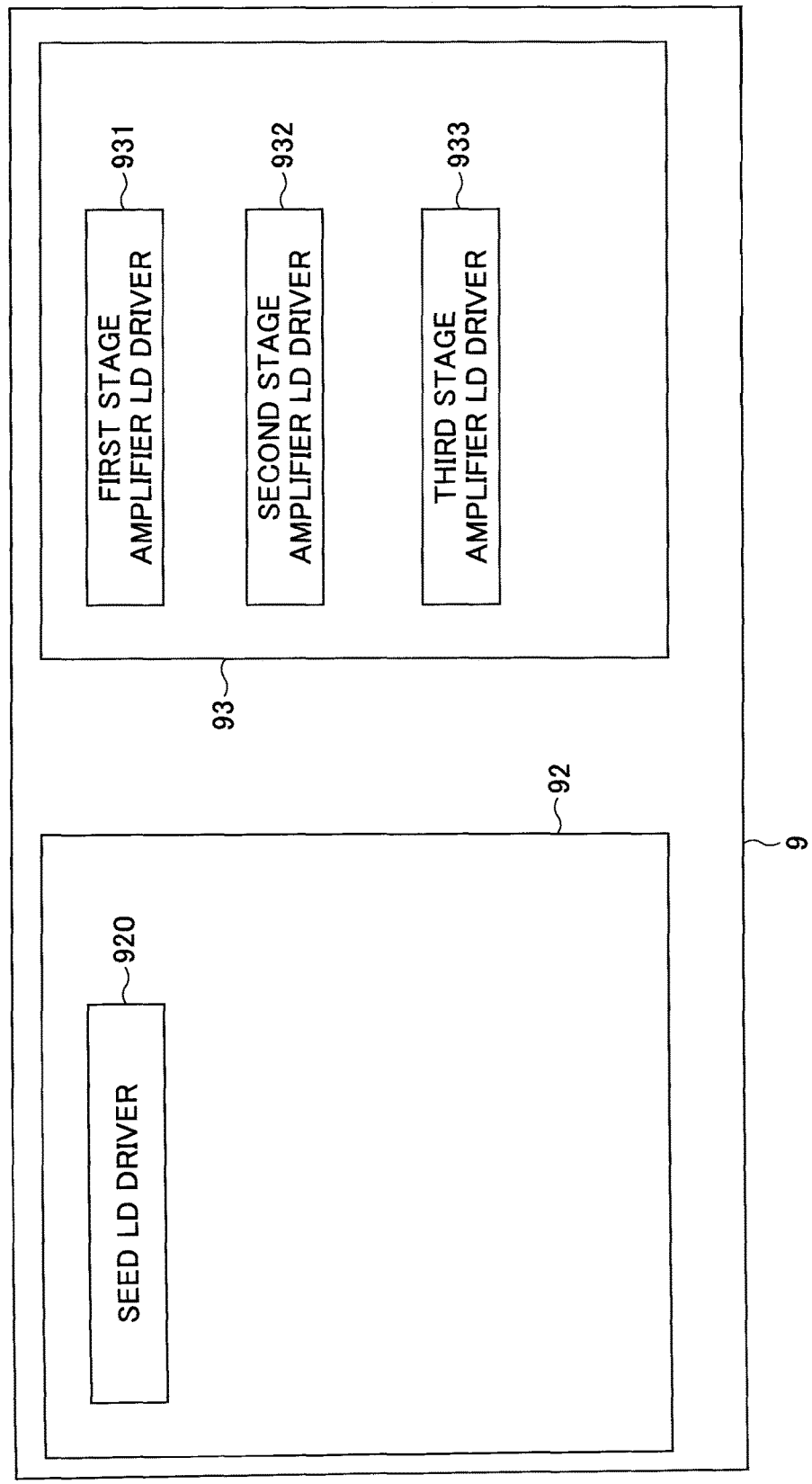

[Fig. 4A]
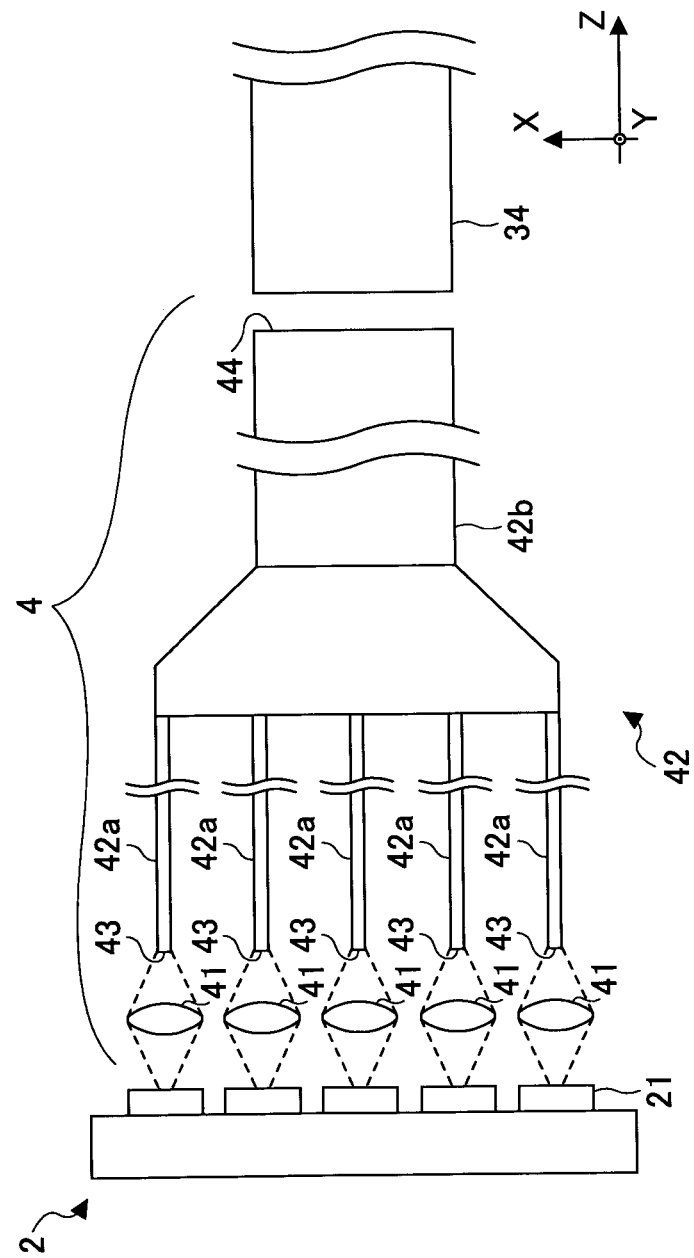

[Fig. 4B]
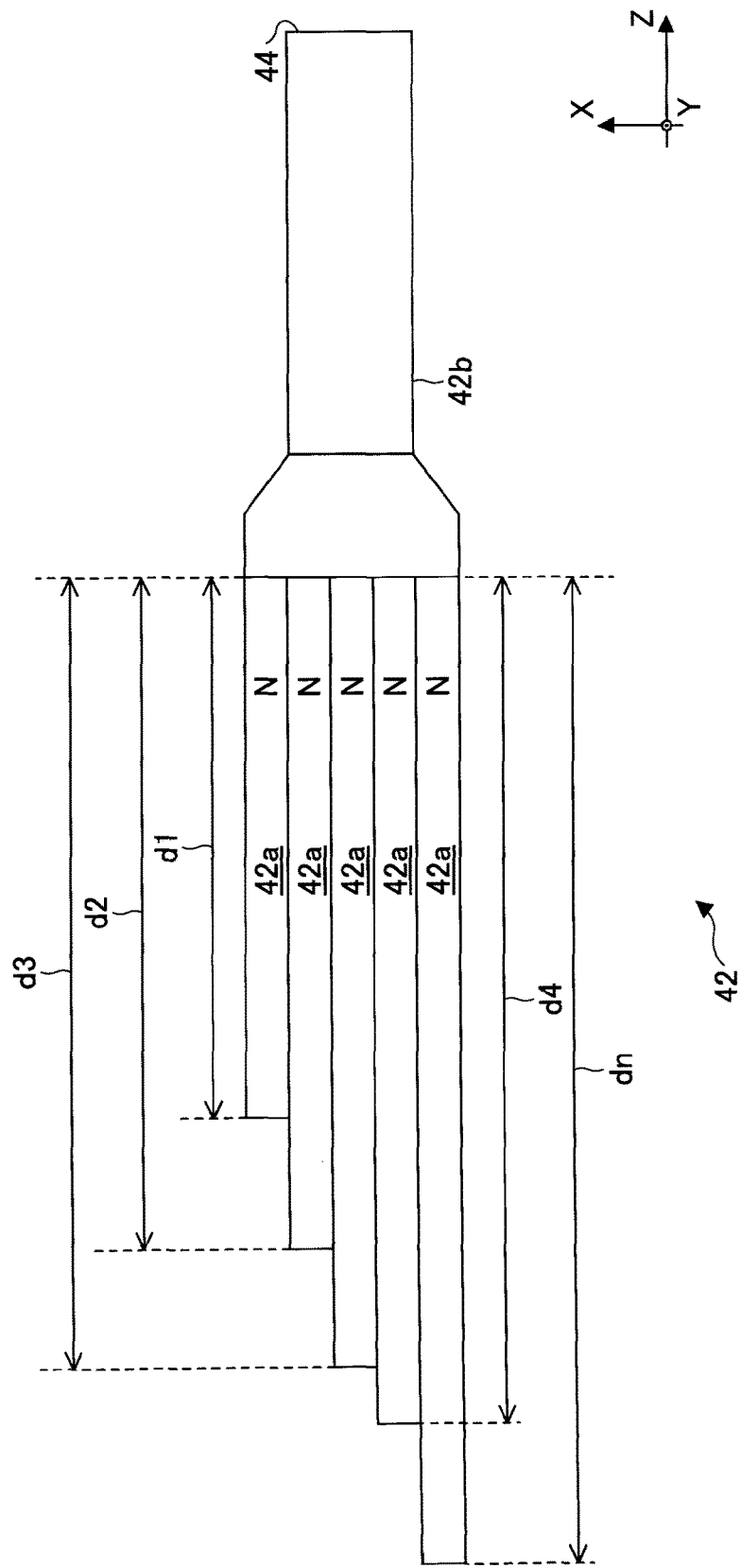

[Fig. 5A]
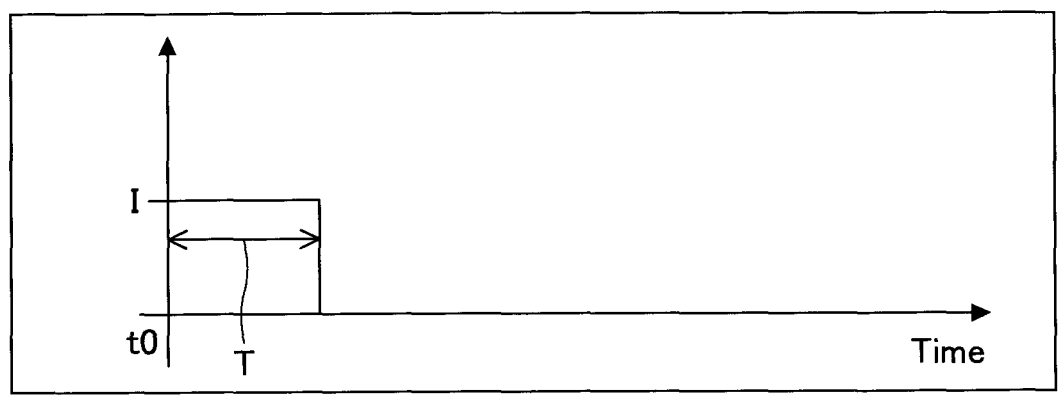
[Fig. 5B]
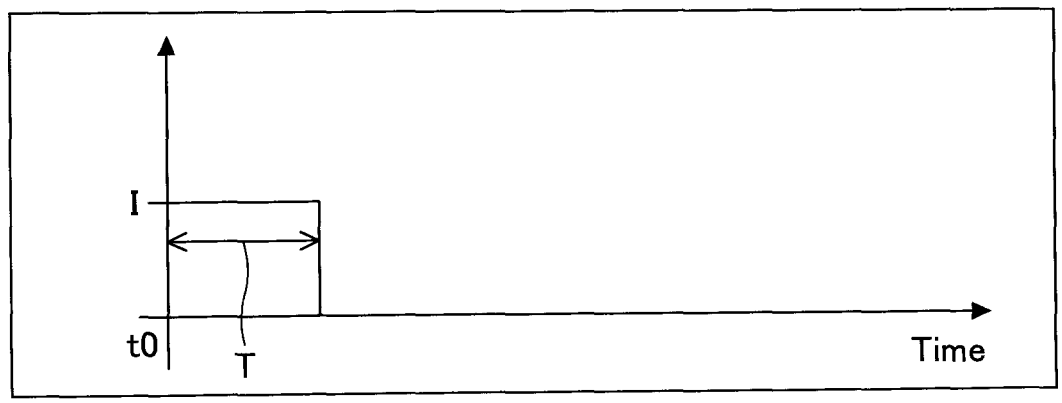

[Fig. 5C]
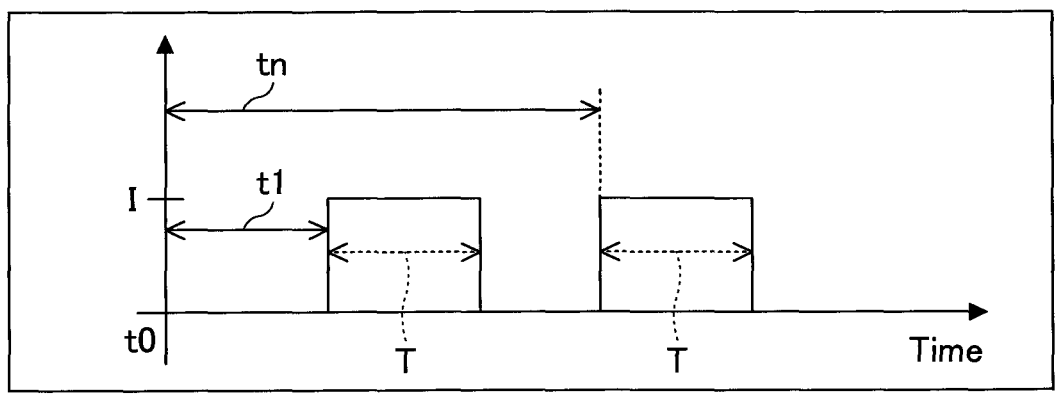

[Fig. 6]
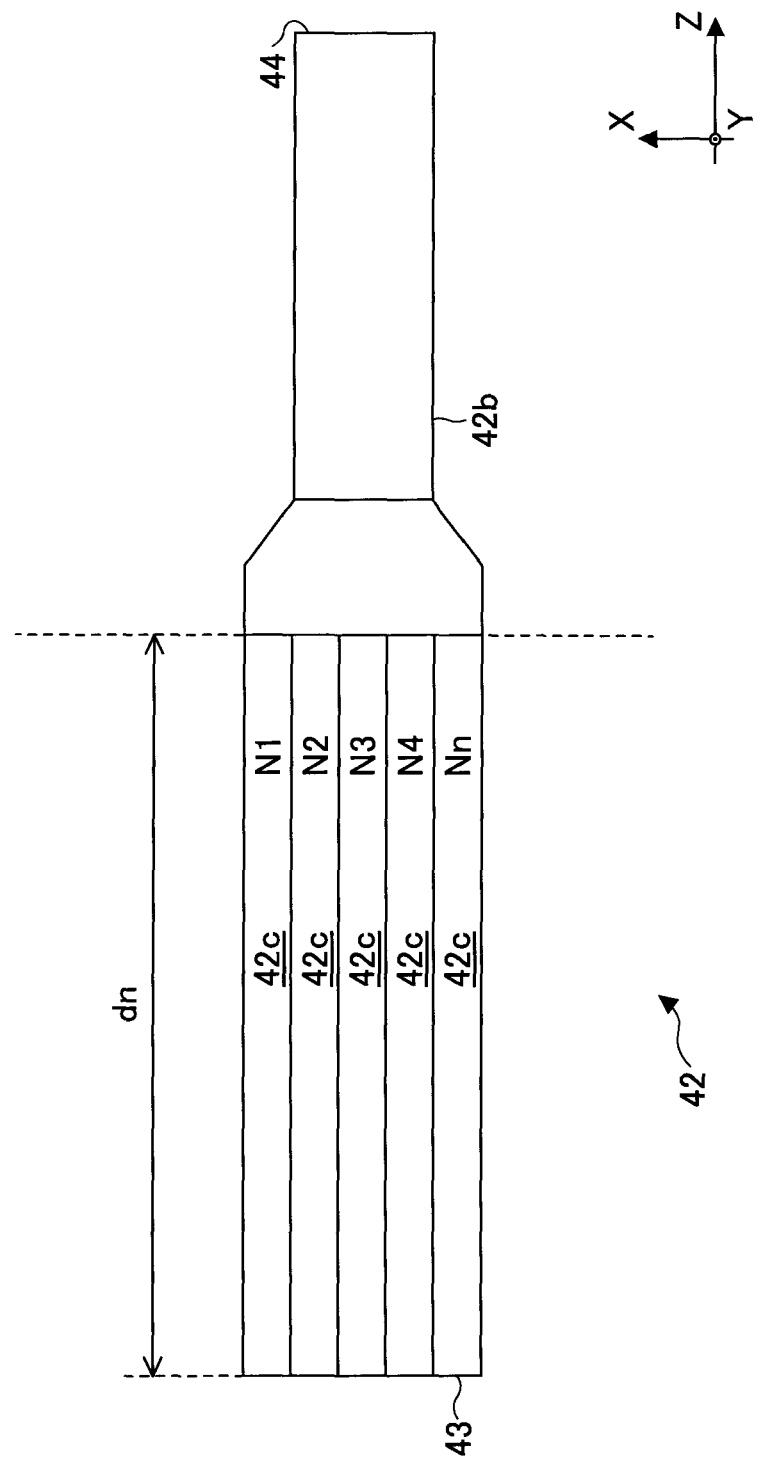

[Fig. 7A]
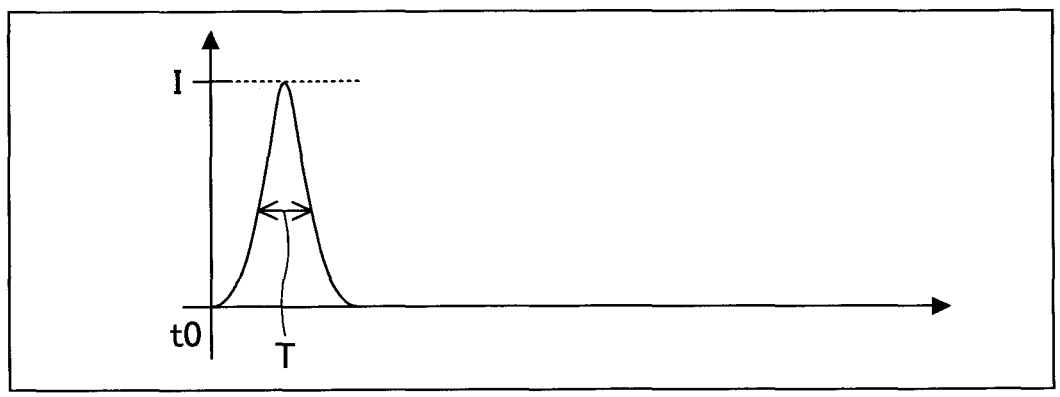
[Fig. 7B]
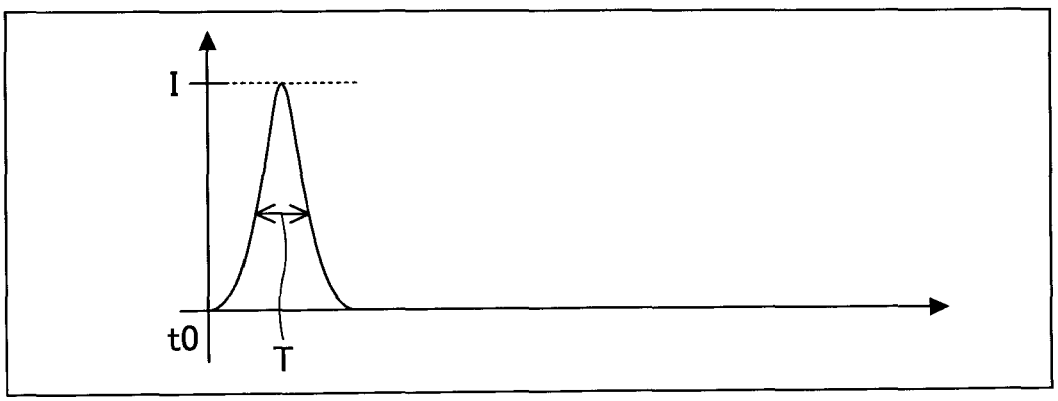

[Fig. 7C]
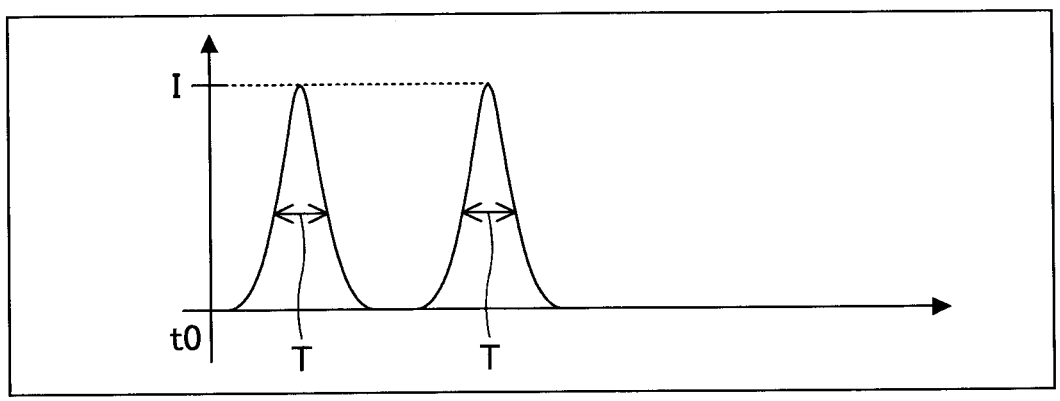

[Fig. 8A]
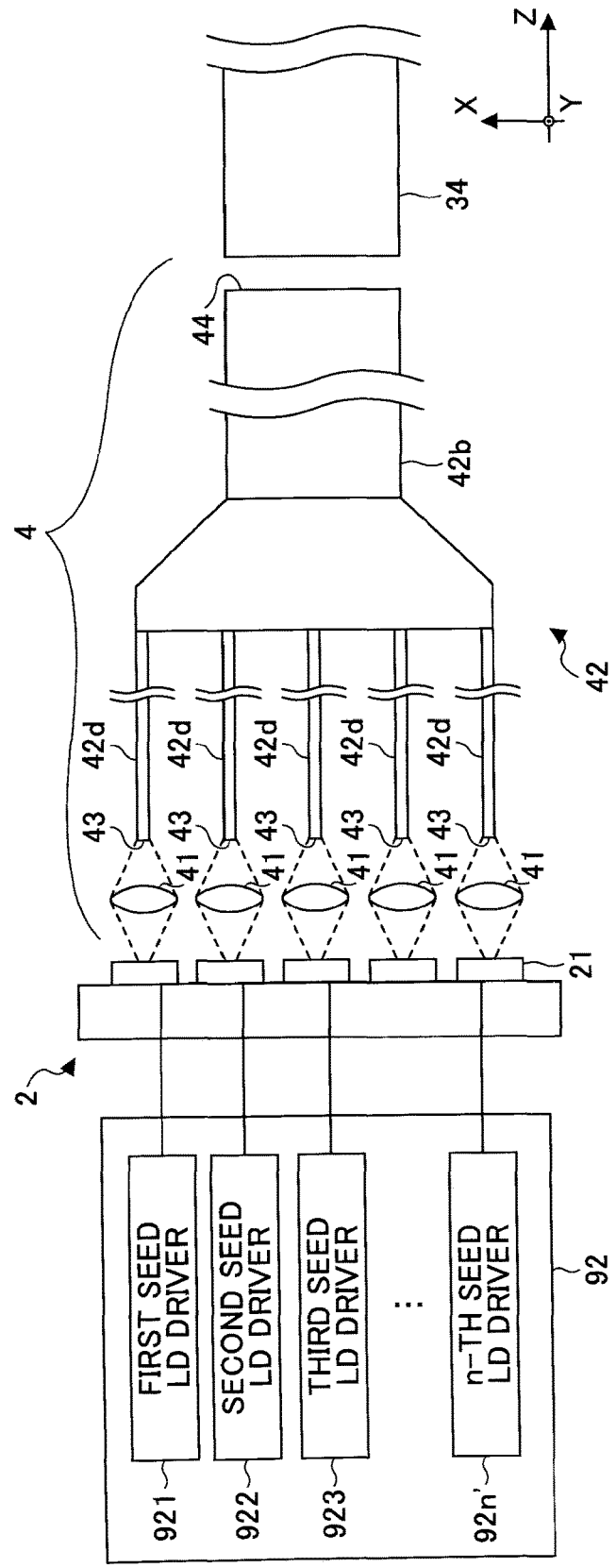

[Fig. 8B]
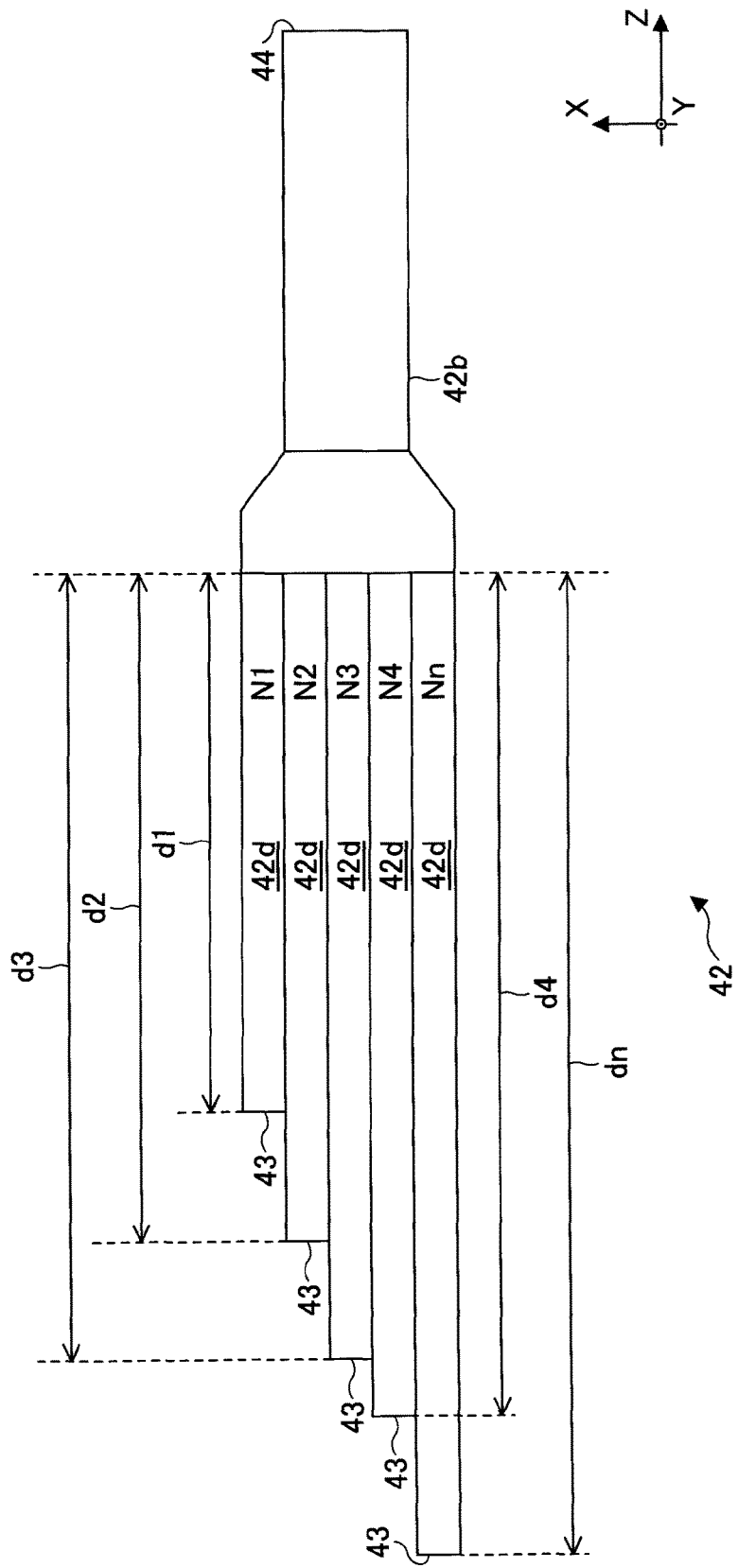

[Fig. 9A]
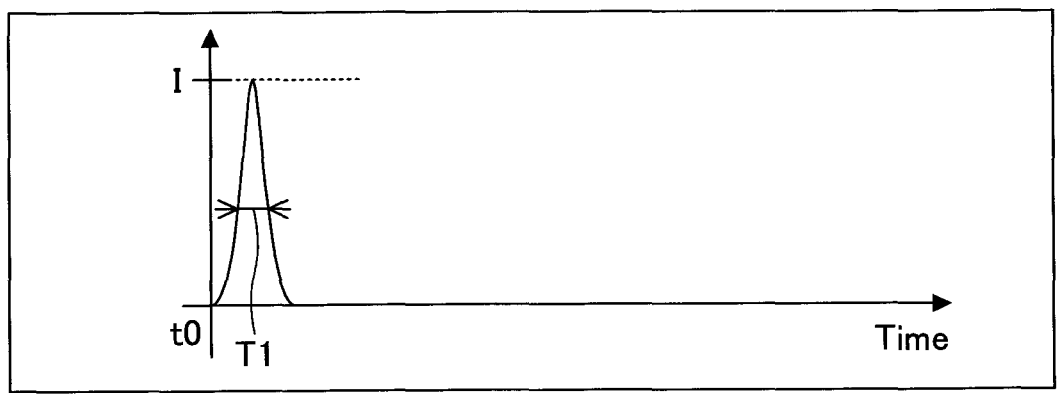
[Fig. 9B]
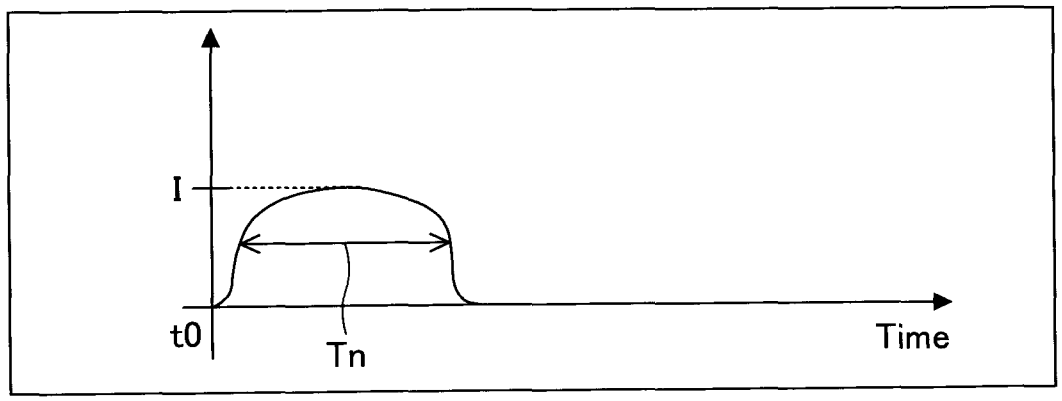

[Fig. 9C]
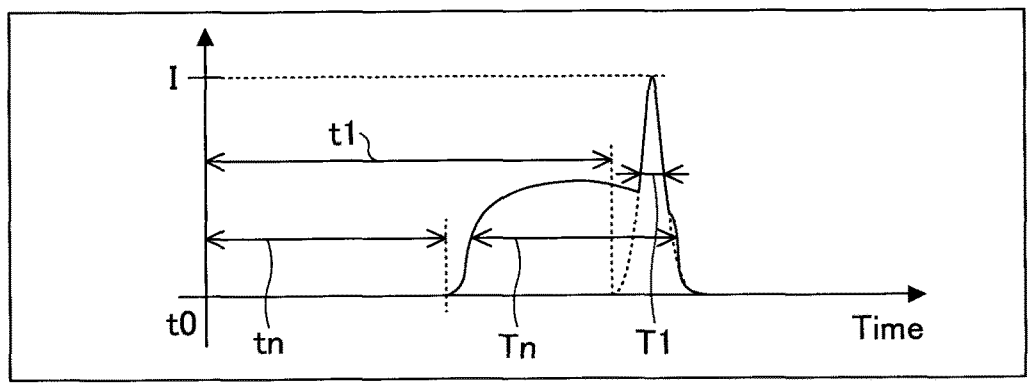
[Fig. 10]
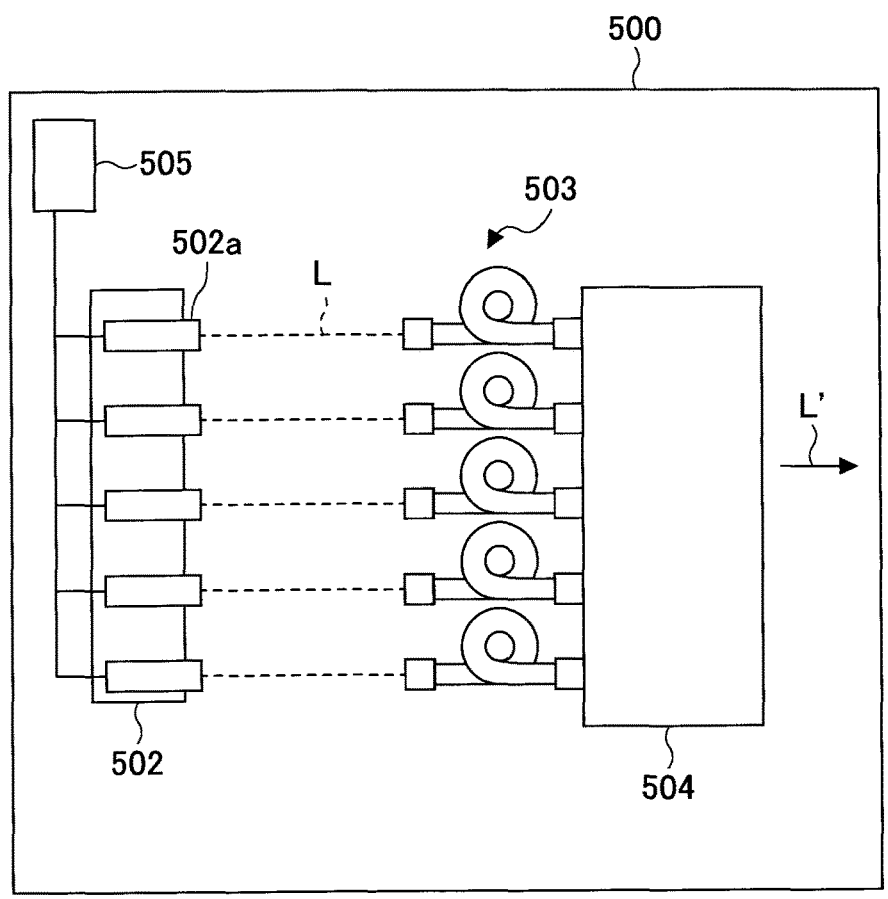

[Fig. 11]
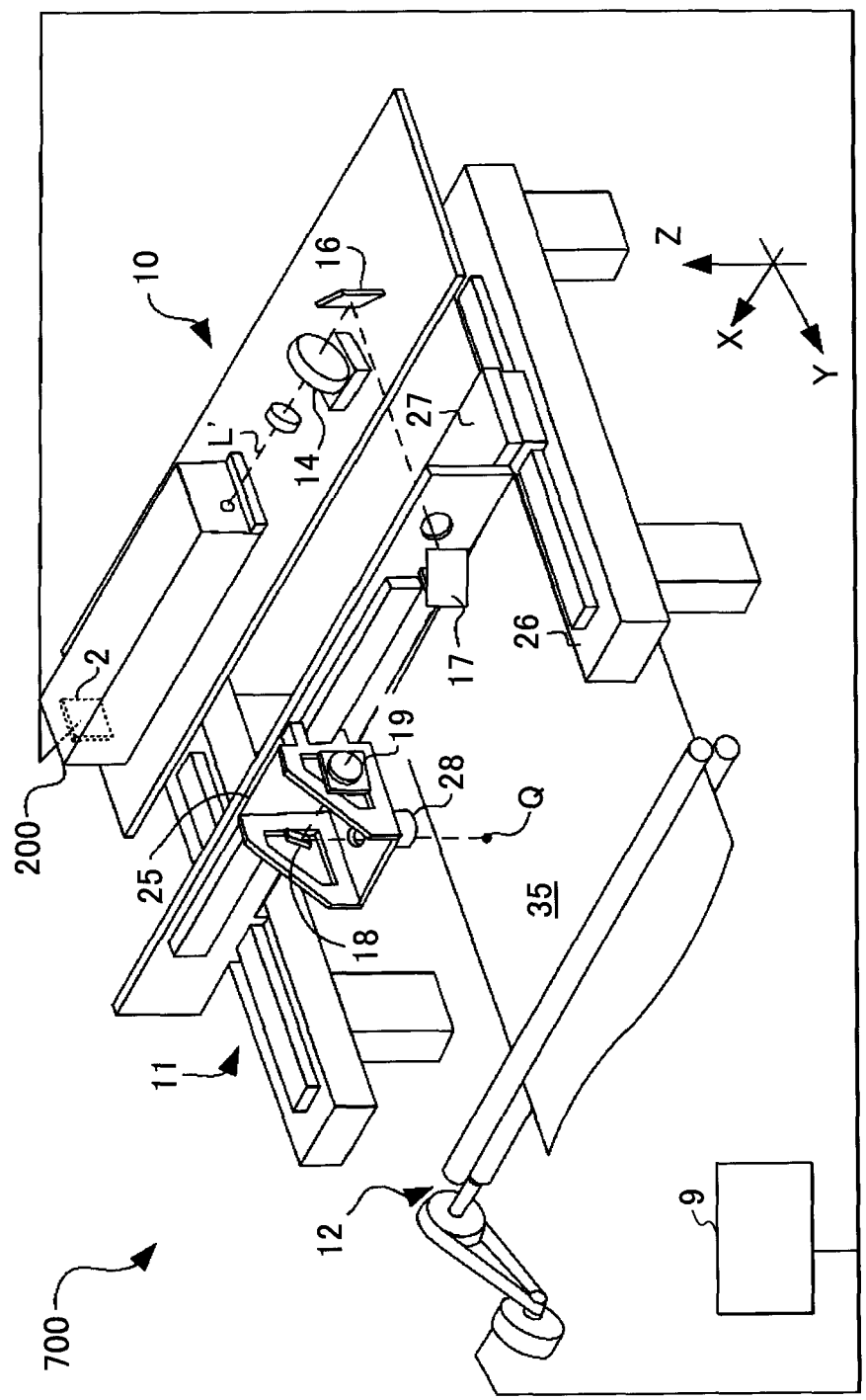

[Fig. 12]
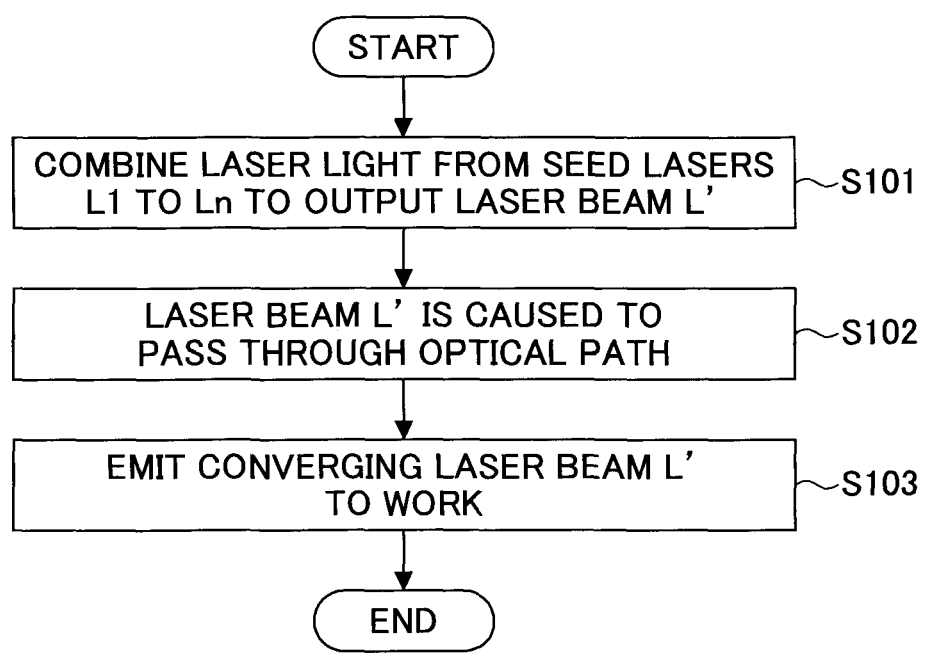

LASER BEAM GENERATION APPARATUS, LASER MACHINING DEVICE, AND LASER MACHINING METHOD

TECHNICAL FIELD

The present disclosure relates to a laser beam generation apparatus, a laser machining device, and a laser machining method.

BACKGROUND ART

It is known that an MOPA (master oscillator and power amplifier) laser beam generation apparatus includes a light source section (MO section) having high-speed modulation controllable semiconductor lasers as seed laser sources, and an optical amplifier (PA section) configured to amplify laser light from the low-power seed lasers and output a high-power laser beam. For example, see PTL 1 listed below.

In the conventional MOPA laser beam generation apparatus, oscillating conditions, such as pulsed waveforms and repetition frequencies of the seed lasers, greatly contribute to the characteristics of the final output laser beam. In particular, a laser beam generation apparatus used for laser machining of a material requires high-speed modulation controllable seed lasers with the capability of setting complicated oscillating conditions to output a short pulse or burst pulse laser beam.

However, the conventional MOPA laser beam generation apparatus uses a method of adjusting a pulse delay of each laser light output from the seed lasers of the two light source sections by an electric control process. In this method, an advanced control technique must be used to control a pulsed waveform in the order of picoseconds. Hence, the conventional MOPA laser beam generation apparatus requires a complicated control system to carry out the method.

CITATION LIST

Patent Literature

PTL 1: Japanese Patent No. 5713541

SUMMARY

Technical Problem

In one aspect, the present disclosure provides a laser beam generation apparatus which has a simple configuration and is able to provide an output waveform to the laser light sources with a high level of accuracy.

Solution to Problem

In one embodiment, the present disclosure provides a laser beam generation apparatus including: a light source section including a plurality of seed lasers each emitting laser light; an optical amplification section disposed to face the seed lasers of the light source section and configured to amplify the laser light emitted from the seed lasers and received at an incidence surface to output the amplified laser light from an emission surface; and a plurality of light-guiding paths configured to guide the laser light emitted by the seed lasers to enter the incidence surface of the optical amplification section, wherein at least one of the plurality of light-guiding paths has an optical distance different from optical distances of other light-guiding paths, wherein the optical amplification section is configured to combine the laser light from the plurality of light-guiding paths and output the combined laser light as a laser beam.

Advantageous Effects of Invention

It is possible for the laser beam generation apparatus according to one embodiment to provide an output waveform to the laser light sources with a high level of accuracy.

The object and advantages of the invention will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIG. 1 is a plan view illustrating an overall configuration of a laser beam generation apparatus according to an embodiment.

FIG. 2 is a diagram illustrating a configuration of a light source section of the laser beam generation apparatus illustrated in FIG. 1.

FIG. 3 is a block diagram illustrating a functional configuration of a control unit of the laser beam generation apparatus illustrated in FIG. 1.

FIG. 4A is a plan view illustrating a first light-guiding optical system of the laser beam generation apparatus illustrated in FIG. 1.

FIG. 4B is a diagram for explaining a configuration of the first light-guiding optical system illustrated in FIG. 4A.

FIG. 5A is a diagram illustrating a waveform of a laser light ray emitted from a seed laser to the first light-guiding optical system illustrated in FIG. 4A.

FIG. 5B is a diagram illustrating a waveform of a laser light ray emitted from another seed laser to the first light-guiding optical system illustrated in FIG. 4A.

FIG. 5C is a diagram illustrating a waveform of the laser light output from the first light-guiding optical system illustrated in FIG. 4A.

FIG. 6 is a diagram for explaining a first modification of the laser beam generation apparatus illustrated in FIG. 1.

FIG. 7A is a diagram illustrating a waveform of a laser light ray emitted from a seed laser to a light-guiding optical system illustrated in FIG. 6.

FIG. 7B is a diagram illustrating a waveform of a laser light ray emitted from another seed laser to the light-guiding optical system illustrated in FIG. 6.

FIG. 7C is a diagram illustrating a waveform of laser light output from the light-guiding optical system illustrated in FIG. 6.

FIG. 8A is a diagram for explaining a second modification of the laser beam generation apparatus illustrated in FIG. 1.

FIG. 8B is a diagram for explaining a configuration of a light-guiding optical element illustrated in FIG. 8A.

FIG. 9A is a diagram illustrating a waveform of a laser light ray emitted from a seed laser to the light-guiding optical element illustrated in FIG. 8B.

FIG. 9B is a diagram illustrating a waveform of a laser light ray emitted from another seed laser to the light-guiding optical element illustrated in FIG. 8B.

FIG. 9C is a diagram illustrating a waveform of laser light output from the light-guiding optical element illustrated in FIG. 8B.

FIG. 10 is a diagram illustrating a comparative example of the laser beam generation apparatus.

FIG. 11 is a diagram illustrating a configuration of a laser machining device including the laser beam generation apparatus.

FIG. 12 is a flowchart for explaining a laser machining method performed by the laser beam generation apparatus.

DESCRIPTION OF EMBODIMENTS

<Overview>

A laser beam generation apparatus according to an embodiment will be described with reference to the accompanying drawings.

FIG. 1 illustrates an overall configuration of a laser apparatus 200 which is the laser beam generation apparatus according to the embodiment.

As illustrated in FIG. 1, the laser apparatus 200 includes a light source section 2 having n laser elements 21 (seed lasers L1 to Ln) configured to emit laser light, an optical amplification section 3 configured to amplify the laser light emitted by the seed lasers L1 to Ln of the light source section 2, and a control unit 9 configured to control the light source section 2 and the optical amplification section 3. In the following, when it is not necessary to specify a particular one of the seed lasers L1 to Ln, the seed lasers L1 to Ln are collectively referred to as a seed laser L.

The laser apparatus 200 further includes a first light-guiding optical system 4 configured to deflect the laser light from the seed laser L so that the deflected laser light enters an incidence surface 31 of the optical amplification section 3, and a second light-guiding optical system 5 configured to emit a laser beam L' from an emission surface 32 of the optical amplification section 3 to a target object. In the following, it is assumed that a direction parallel to an optical axis of the seed laser L is represented by the +Z direction of an XYZ three-dimensional rectangular coordinate system.

The control unit 9 includes an oscillating condition control unit 92 configured to determine oscillating conditions of the seed laser L of the light source section 2, such as a pulsed waveform and a repetition frequency of the laser light, and an amplification condition control unit 93 configured to control amplification conditions for amplifying the laser light entering the optical amplification section 3. The control unit 9 may be implemented by a processor, such as a CPU (central processing unit), which is coupled to a memory. The above units 92 and 93 represent functions and units implemented by any of the elements and devices illustrated in FIG. 1, which are activated by instructions from the processor based on programs stored in the memory.

Operation of the laser apparatus 200 will be described briefly.

The seed laser L (each laser element 21) of the light source section 2 is caused to emit the laser light in the +Z direction according to the oscillating conditions determined by the oscillating condition control unit 92. The laser light from the seed laser L is deflected to the incidence surface 31 of the optical amplification section 3 by the first light-guiding optical system 4.

The optical amplification section 3 amplifies the laser light, which has entered the incidence surface 31, according to amplification conditions, and emits the laser beam L', obtained by the amplified laser light, from the emission surface 32.

The laser beam L' from the emission surface 32 of the optical amplification section 3 is focused (and/or deflected) by the second light-guiding optical system 5, so that the focused laser beam is emitted to the target object.

In the laser apparatus 200 in the above embodiment, the first light-guiding optical system 4 is utilized in order to increase the incidence efficiency of laser light from the light source section 2 to the optical amplification section 3. However, the present disclosure is not limited to this embodiment. Alternatively, the laser apparatus 200 may be configured so that the light source section 2 and the optical amplification section 3 are connected directly by using an optical fiber or the like. Further, the first light-guiding optical system 4 may be implemented by a focusing optical system including optical elements having focusing characteristics.

<Detailed Configuration>

Next, a detailed configuration of the laser apparatus 200 will be described.

FIG. 2 illustrates a configuration of the light source section 2. The light source section 2 is implemented by a VCSEL (vertical cavity surface emitting laser) surface emitting laser array. As illustrated in FIG. 2, in the surface emitting laser array of the light source section 2, 25 laser elements 21 (or the seed lasers L1 to Ln) are arrayed in five columns and five rows in a two-dimensional formation on a surface of the light source section 2 on the +Z direction side.

Each laser element 21 (the seed laser L) serves as a seed light source or seed lasers configured to output laser light. A wavelength of the laser light output from the seed laser L is approximately equal to 1060 nm. It is preferable that the seed laser L is of single mode output type.

The optical amplification section 3 serves as a laser amplifier, i.e., an optical amplifier configured to combine the laser light output from the seed lasers L1 to Ln (the laser elements 21) of the light source section 2 to emit the laser beam L'.

As illustrated in FIG. 1, the optical amplification section 3 includes three optical fiber amplifiers 33a, 33b, and 33c. Each of the optical fiber amplifiers 33a, 33b, and 33c has a core portion which is made of silica glass as a main ingredient, and a rare-earth element, such as Yb (ytterbium), is doped in the core portion as an activation material. WDM (wavelength division multiplexing) couplers 34a, 34b, and 34c which serve as excitation light coupling optical elements are respectively attached to end portions of the optical fiber amplifiers 33a, 33b, and 33c on the −Z direction side. A pair of the optical fiber amplification section 33a and the WDM coupler 34a operates as a coupling amplifier and serves as a first stage amplifier disposed in the most upstream position of the optical amplification section 3.

Similarly, a pair of the optical fiber amplification section 33b and the WDM coupler 34b operates as a second stage amplifier of the optical amplification section 3, and a pair of the optical fiber amplification section 33c and the WDM coupler 34b operates as a third stage amplifier of the optical amplification section 3.

In this embodiment, the first stage amplifier, the second stage amplifier, and the third stage amplifier are connected in series to implement the optical amplification section 3 as illustrated in FIG. 1.

Each of the WDM couplers 34a, 34b, and 34c serves as an optical multiplexer to combine a plurality of light rays having respective wavelengths and waveforms, and serves as an optical demultiplexer to divide the combined light beam into separate light rays having respective wavelengths and waveforms. When the laser light from the seed lasers L1 to Ln passes through the WDM coupler 34a disposed in the most upstream position in the −Z direction, the laser light from the seed lasers L1 to Ln is combined by the WDM coupler 34a, and the laser beam obtained by combining the laser light enters the optical fiber amplification section 33a, so that the laser beam is amplified by the optical fiber amplification section 33a.

Each of the WDM couplers 34a, 34b, and 34c causes an excitation light P from an excitation light source 934, in addition to the laser light from the seed laser L, to enter the corresponding one of the optical fiber amplifiers 33a, 33b, and 33c based on the amplification conditions controlled by the amplification condition control unit 93.

Each of the optical fiber amplifiers 33a, 33b, and 33c amplifies the laser light having a wavelength in the vicinity of 1060 nm, which is included in a gain wavelength band, according to the induced emission arising by the excitation of Yb by the excitation light P. It is preferable that the wavelength of the excitation light P is varied depending on the type of the activation material. In this embodiment, the excitation light P having a wavelength of 975 nm which is included in the absorption band of Yb is used.

In this embodiment, the three optical fiber amplifiers 33a, 33b, and 33c are connected in series to implement the optical amplification section 3. Alternatively, the optical amplification section 3 may be implemented by at least one pair of the optical fiber amplifier and the WDM coupler to emit the laser beam L'. Further, the optical amplification section 3 may be implemented by four or more optical fiber amplifiers connected to serve as a single optical amplifier.

In addition, a main amplifier of a different type may be attached to the +Z direction end portion of the optical fiber amplification section 33c disposed in the most downstream position in the direction of the optical axis.

Further, a WDM coupler 34d is disposed at the end of the optical amplification section 3 in the +Z direction as a separation unit to separate the excitation light P from the laser beam L'.

Note that the WDM coupler 34d is not an essential component, and a gain fiber having an appropriate length may be disposed instead of the WDM coupler 34d.

In this embodiment, the light source section 2 is implemented by a single VCSEL unit. Alternatively, the laser apparatus 200 may be configured to include two or more light source sections 2, and two or more optical amplifiers 3 corresponding to the light source sections 2, which are connected in parallel, and a beam combiner attached to the end portions of the optical amplifiers 3. By this configuration, it is possible to increase the output power of the laser beam L'.

FIG. 3 illustrates a functional configuration of the control unit 9. As illustrated in FIG. 3, the amplification condition control unit 93 includes a first stage amplifier LD (laser diode) driver 931 configured to control the excitation light P being supplied to the WDM coupler 34a attached to the first stage optical fiber amplification section 33a.

The amplification condition control unit 93 includes a second stage amplifier LD driver 932 configured to control the excitation light P being supplied to the WDM coupler 34b attached to the second stage optical fiber amplification section 33b.

The amplification condition control unit 93 includes a third stage amplifier LD driver 933 configured to control the excitation light P being supplied to the WDM coupler 34c attached to the third stage optical fiber amplification section 33c.

The first stage amplifier LD driver 931, the second stage amplifier LD driver 932, and the third stage amplifier LD driver 933 may be controlled to operate independently of each other, such that the excitation light rays P from the light sources 934 are amplified based on mutually different amplification conditions to emit different excitation light rays P.

In this embodiment, the excitation light source 934 is used as the excitation LD which emits the excitation light P.

Alternatively, each of the first stage amplifier LD driver 931, the second stage amplifier LD driver 932, and the third stage amplifier LD driver 933 may be configured to emit the excitation light P according to the amplification condition. Further, the excitation light source 934 may be provided outside the laser apparatus 200.

As illustrated in FIG. 3, the oscillating condition control unit 92 includes a seed LD control unit 920 which is configured to control the waveforms of the laser light emitted by the seed lasers L1 to Ln (the laser elements 21).

The seed LD control unit 920 functions as an arbitrary waveform generator to set up a pulse width T of the seed laser L, a pulse height value I of the seed laser L, and a pulse delay D of the seed laser L (which indicates a rise timing of the pulse).

FIG. 4A illustrates the first light-guiding optical system 4 of the laser beam generation apparatus illustrated in FIG. 1. As illustrated in FIG. 4A, the first light-guiding optical system 4 includes a microlens array 41 and a coupling fiber 42. The microlens array 41 is disposed adjacent to the side of the light source section 2 in the +Z direction and includes a plurality of microlenses configured to convert the laser light rays from the seed lasers L1 to Ln into focusing laser light rays, respectively. The coupling fiber 42 has an end portion disposed in a vicinity of the focus of the microlens array 41.

The microlens array 41 converts the laser light from each of the seed lasers L1 to Ln (the laser elements 21) into focusing laser light, so that the focusing laser light enters the incidence end portion 43 of the coupling fiber 42. The coupling fiber 42 includes 25 branch fiber portions 42a formed as separate fiber portions, and a joint fiber portion 42b configured to couple the branch fiber portions 42a as a single fiber. In other words, the coupling fiber 42 is constructed by bundling the 25 branch optical fibers with a refractive index N and different fiber lengths. The coupling fiber 42 further includes the 25 incidence end portions 43 extending in the −Z direction, and the single emission end portion 44 extending in the +Z direction.

The incidence end portions 43 of the coupling fiber 42 extending in the −Z direction are disposed to face the laser elements 21 of the laser source section 2, respectively, in a one-to-one correspondence. The other end portion of the coupling fiber 42 extending in the +Z direction is connected to the WDM coupler 34a.

In this embodiment, the other end portion of the coupling fiber 42 extending in the +Z direction is connected to the WDM coupler 34a. Alternatively, the other end portion of the coupling fiber 42 may be disposed to face the incidence surface 31 of the optical amplification section 3.

The coupling fiber 42 is disposed between the light source section 2 and the optical amplification section 3 and has independent optical distances D1 to Dn corresponding to the seed lasers L1 to Ln. The optical distances are also called optical path lengths. Generally, an optical distance of a light-guiding path is determined by the product of a physical length of the light-guiding path and a refractive index of a substance that forms the light-guiding path. Namely, as illustrated in FIG. 4B, the optical distances D1 to Dn of the coupling fiber 42 are determined by the products of physical lengths (i.e., physical lengths d1 to dn) of the branch fiber portions 42*a* of the coupling fiber 42 and refractive indices N1 to Nn of the branch fiber portions 42*a*, respectively.

In this embodiment, quartz is fixedly used as a material of the branch fiber portions 42*a*, and the optical distances D1 to Dn thereof are determined by setting up the physical lengths (or the physical lengths d1 to dn) of the branch fiber portions 42*a*.

FIG. 10 illustrates a comparative example of the laser beam generation apparatus. As illustrated in FIG. 10, the comparative example is an MOPA laser apparatus 500. The MOPA laser apparatus 500 includes a seed light source 502, optical fiber amplifiers 503, a combiner 504, and a control unit 505. In the seed light source 502, a plurality of edge emitting lasers 502*a* are arrayed in parallel. The optical fiber amplifiers 503 are arrayed in parallel as the optical amplifier to face the corresponding edge emitting lasers 502*a*.

A method of controlling a pulse profile of a laser beam L' output from the laser apparatus 500 is that the edge emitting lasers 502*a* are controlled independently of each other by the control unit 505 to set up a pulse width, a delay time, etc., of each laser to predetermined values, and the laser light rays from the edge emitting lasers 502*a* are combined into the laser beam L' by the combiner 504.

However, setting the pulse width and the delay time of each of the edge emitting lasers 502*a* to the predetermined values will cause the control unit 505 to have a complicated configuration, and the minor differences in performance and the synchronization problem will be vulnerable to deviation of the final output waveform.

Moreover, the pulse delay t allowable for the edge emitting lasers 502*a* is not increased to a resolution higher than that of the performance of the control unit 505, and it is difficult to perform highly accurate control, such as adjusting the pulse delay t according to the rise time of the seed laser L.

Further, in the case of the electric control using the control unit 505, a highly advanced control technique is required to achieve the level of accuracy of the order of picoseconds.

Thus, it is difficult for the edge emitting lasers to output a short pulse laser beam or a multi-channel laser beam. Also, there is the problem of synchronization between the drivers. Hence, for the purpose of application to laser machining devices in the machining field or the medical field which require a high level of accuracy, a laser apparatus capable of performing highly accurate control is demanded.

As described in the foregoing, in this embodiment, the light source section 2 is implemented by the surface emitting laser array in which the surface emitting lasers (the laser elements 21) as the emission points are arrayed in a two-dimensional formation.

Generally, the edge emitting lasers require a cleavage process and it is difficult for the edge emitting lasers to output a short pulse laser beam. However, it is possible for the surface emitting lasers to output a short pulse laser beam because the surface emitting lasers are produced by utilizing a thin-film laminating process.

Further, the level of integration of the surface emitting lasers is easily increased and it is possible for the surface emitting lasers to output a multi-channel laser beam. Hence, the laser beam generation apparatus according to this embodiment provides a high level of controllability.

Further, the volume of the active region of the surface emitting laser is small, and the carriers may be sufficiently introduced by a comparatively small amount of current. The vibration at a rise timing (relaxed vibration) is prevented, thereby facilitating the short-pulse drive control.

Next, the control of an output waveform of the laser beam L' according to this embodiment will be described.

The control unit 9 causes the oscillating condition control unit 92 to determine collectively the oscillating conditions of each of the seed lasers L1 to Ln.

FIG. 5A illustrates a pulsed waveform of the laser light ray emitted from the seed laser L1 to the incidence end portion 43 of the coupling fiber 42 illustrated in FIG. 4A. FIG. 5B illustrates a pulsed waveform of the laser light ray emitted from the seed laser Ln to the incidence end portion 43 of the coupling fiber 42 illustrated in FIG. 4A. As illustrated in FIGS. 5A and 5B, the pulsed waveforms of the laser light rays from the seed lasers L1 to Ln have an identical shape and are synchronized. FIG. 5C illustrates a pulsed waveform of the laser light of the seed lasers L1 to Ln output from the emission end portion 44 of the coupling fiber 42 illustrated in FIG. 4A.

The laser light from the seed lasers L1 to Ln (the laser elements 21) is converted into the focusing laser light by the microlens array 41, and the focusing laser light enters the incidence end portions 43 of the coupling fiber 42. The focusing laser light of the seed lasers L1 to Ln passes through the branch fiber portions 42*a* with the different physical lengths d1 to dn and combined by the joint fiber portion 42*b*, and the combined laser light is output from the emission end portion 44 to the optical amplification section 3.

In this embodiment, the pulsed waveform of each of the laser light rays from the seed lasers L1 to Ln is set to a rectangular pulsed waveform. The waveform of each laser light ray is not limited to this embodiment. Alternatively, the waveform of each laser light ray may be set to a triangular pulsed waveform, or may be set to a normal distribution pulsed waveform, such as a Gaussian distribution pulsed waveform, as illustrated in FIGS. 7A to 7C or FIGS. 9A to 9C.

When the laser light rays of the seed lasers L1 to Ln pass through the branch fiber portions 42*a*, the laser light rays travel through the optical fiber 42 by the different physical lengths d1 to dn. Namely, the optical distances D1 to Dn by which the laser light rays travel through the optical fiber 42 are also different.

The times t1 to tn needed for the laser light rays of the seed lasers L1 to Ln to pass through the branch fiber portions 42*a* are proportional to the optical distances D1 to Dn thereof. Hence, the waveform of the laser light of the seed lasers L1 to Ln, when outputting from the emission end portion 44 to the optical amplification section 3, is consistent with the waveform illustrated in FIG. 5C.

In this way, the branch fiber portions 42*a* are configured to delay or advance the laser light rays of the seed lasers L1 to Ln from an arbitrary reference time t0 by changing the optical distances D1 to Dn of the branch fiber portions 42*a*, and control the waveform of the combined laser light of the seed lasers L1 to Ln. In other words, the branch fiber portions 42*a* are configured to determine the pulse delays t1 to tn by the optical distances D1 to Dn of the branch fiber portion 42*a*.

After the laser light of the seed lasers L1 to Ln is combined by the WDM coupler 34*a*, the combined laser light is amplified by the optical fiber amplification section 33*a*.

The determination of the pulse delays t1 to tn by the optical distances of the branch fiber portions 42*a*, instead of independently setting up the pulse delays t1 to tn by the oscillating condition control unit 92, may provide a simplified composition and an increased level of accuracy.

Specifically, if the physical length dn is greater than the physical length d1 (that is a reference distance for the branch fiber portions 42a) by 1 meter, it is possible to achieve the pulse delay (tn–t1) on the order of 5.0 nanoseconds. In practical applications, the physical length dn of the branch fiber portion 42a may be set up at least with the level of accuracy of $10^3$ meters or greater, and the pulse delay (tn–t1) may be set up with the level of accuracy of the order of picoseconds ($10^{-11}$ to $10^{-12}$ seconds).

In this way, the optical distances of the branch fiber portions 42a are changed to control the seed lasers L1 to Ln, and the laser apparatus 200 controls the waveform of the output laser beam L' with a high level of accuracy using a simple composition.

In this embodiment, the laser apparatus 200 includes the light source section 2 including the plurality of seed lasers L1 to Ln (the laser elements 21) each emitting laser light. Namely, the laser apparatus 200 which is the laser beam generation apparatus of this embodiment includes the light source section 2 including the plurality of seed lasers L1 to Ln (the emission points) each emitting laser light.

The laser apparatus 200 includes the optical amplification section 3 disposed to face the seed lasers L1 to Ln of the light source section 2 (the side of the light source section 2 in the +Z direction) and configured to amplify the laser light emitted by the seed lasers L1 to Ln and received at an incidence surface 31 of the optical amplification section 3 to output the amplified laser light from an emission surface 32 of the optical amplification section 3.

The laser apparatus 200 includes the branch fiber portions 42a which are a plurality of light-guiding paths disposed adjacent to the side of the light source section 2 in the +Z direction and configured to guide the laser light emitted from each of the seed lasers L1 to Ln to the incidence surface 31 of the optical amplification section 3.

In this embodiment, the case where an incidence surface of the branch fiber portions 42a and an emission surface of the joint fiber portion 42b are parallel to each other has been described. However, the present disclosure is not limited to this embodiment. Alternatively, the emission surface of the joint fiber portion 42b and the incidence surface of the branch fiber portions 42a may not be parallel to each other.

The optical distances D1 to Dn of the branch fiber portions 42a may be set up independently of each other. In this embodiment, the optical distances D1 to Dn of the branch fiber portions 42a are different from one another. Hence, an optical distance of at least one of the plurality of light-guiding paths is different from the optical distances of other light-guiding paths. With this configuration, the pulse delay t of the seed laser L is set up.

The optical amplification section 3 combines the laser light emitted by the seed lasers L1 to Ln (the laser elements 21) and outputs the combined laser light as a laser beam L'. Hence, the optical amplification section 3 is configured to combine the laser light emitted by the emission points and output the combined laser light as the laser beam L'.

With this configuration, the laser apparatus 200 controls the waveform of the finally output laser beam L' with a high level of accuracy.

In this embodiment, the branch fiber portions 42a are implemented by a plurality of physically independent optical fibers. The present disclosure is not limited to this embodiment. Alternatively, the light-guiding paths may be implemented by light-guiding path optical systems in which lens thicknesses are adjusted to determine the optical distances thereof independently of each other.

The laser apparatus 200 includes the optical fiber amplifiers 33a, 33b, and 33c which are connected in series to implement the optical amplification section 3. With this configuration, the pulse height value I of the seed laser L (or the laser output) is increased in a stepwise manner, and the laser light is amplified efficiently while the influence on the pulse width T of the seed laser L is suppressed.

The light source section 2 is implemented by a VCSEL (vertical cavity surface emitting laser) surface emitting laser array in which the laser elements 21 are arrayed in a two-dimensional formation on an XY plane perpendicular to the optical axis of the seed laser L extending in the +Z direction. With this configuration, the degree of integration of the laser elements 21 is easily increased, and the laser apparatus 200 controls the waveforms of the final output laser beam L' with a high level of accuracy.

In this embodiment, the branch fiber portions 42a and the joint fiber portion 42b are implemented by optical fibers including a core material of quartz. Further, these optical fibers are configured to have mutually different physical lengths d1 to do and the branch fiber portions 42a have mutually different optical distances D1 to Dn.

With this configuration, the pulse delay t of the seed laser L is determined by the physical length of the optical fiber with a high level of accuracy, and the waveform of the final output laser beam L' is determined by simple composition with a high level of accuracy. Further, the refractive index differences in the optical paths of the first light-guiding optical system 4 are reduced, the reflection loss at boundary portions is reduced, and the transmission efficiency is increased.

<Modifications>

Next, modifications of the above-described embodiment will be described. The laser apparatus 200 may be configured to set up the optical distances D1 to Dn of the seed lasers L1 to Ln according to the refractive index difference. FIG. 6 illustrates a first modification of the laser beam generation apparatus. In FIG. 6, the elements which are essentially the same as corresponding elements in FIG. 4B are designated by the same reference signs and a description thereof is omitted.

In the first modification, as illustrated in FIG. 6, the coupling fiber 42 includes the joint fiber portion 42b and a plurality of branch fiber portions 42c disposed adjacent to the seed lasers L1 to Ln (the laser elements 21) of the light source section 2.

In the first modification, the elements other than the branch fiber portions 42c, which are essentially the same as corresponding elements of the laser apparatus 200 of the previously described embodiment, are designated by the same reference signs and a description thereof is omitted.

In the first modification, the branch fiber portions 42c are implemented by optical fibers having different refractive indices N1 to Nn. In each of the optical fibers, a small amount of an impurity element (dopant), such as germanium, phosphorus, boron, or fluoride, is doped in quartz as a major substance of the optical fiber.

In the first modification, a case in which a different refractive index for each of the optical fibers is set up by adding a small amount of a dopant to quartz of the optical fiber. Alternatively, optical fibers made of a resin or plastic may be used to implement the branch fiber portions 42c.

As illustrated in FIG. 6, the physical length do of each of the branch fiber portions 42c is equal for all the branch fiber portions 42c. Hence, the optical distances D1 to Dn of the branch fiber portions 42c are determined according to the refractive indices N1 to Nn of the branch fiber portions 42c, respectively.

When outputting the laser beam L' by using the above-described coupling fiber 42 illustrated in FIG. 6, each of pulsed waveforms of the laser light rays emitted from the seed lasers L1 to Ln to the incidence end portions 43 has an identical shape as illustrated in FIGS. 7A and 7B. FIG. 7A illustrates the pulsed waveform of the laser light ray emitted from the seed laser L1 to the incidence end portion 43 in FIG. 6. FIG. 7B illustrates the pulsed waveform of the laser light ray emitted from the seed laser Ln to the incidence end portion 43 in FIG. 6. FIG. 7C illustrates a pulsed waveform of the laser light of the seed lasers L1 to Ln output from the emission end portion 44 in FIG. 6.

The laser light of the seed lasers L1 to Ln passes through the branch fiber portions 42c having the different optical distances D1 to Dn and is combined by the joint fiber portion 42b, and the combined laser light is output from the emission end portion 44 to the optical amplification section 3.

When passing through the branch fiber portions 42c, the laser light rays of the seed lasers L1 to Ln pass through the different optical distances D1 to Dn of the branch fiber portions 42c, respectively. Hence, the times t1 to tn needed for the laser light rays to pass through the branch fiber portions 42c are in proportion to the optical distances D1 to Dn, respectively, and the laser light of the seed lasers L1 to Ln at the time of outputting from the emission end portion 44 to the optical amplification section 3 has the waveform as illustrated in FIG. 7C.

In this way, the branch fiber portions 42c are configured to have mutually different refractive indices N1 to Nn, and the branch fiber portions 42c have mutually different optical distances D1 to Dn so as to delay the laser light of the seed lasers L1 to Ln from the reference time t0, in order to determine the waveform of the combined laser light of the seed lasers L1 to Ln. In other words, the pulse delays t1 to tn are determined according to the optical distances D1 to Dn of the branch fiber portions 42c.

Similar to the previously described embodiment of FIG. 1, when the laser light of the seed lasers L1 to Ln passes through the WDM coupler 34a, the laser light of the seed lasers L1 to Ln is combined by the WDM coupler 34a, and the laser beam obtained by combining the laser light is amplified by the optical amplification section 3, so that the amplified laser beam is output from the emission surface 32 as the laser beam L'.

In the first modification, the optical fibers are configured to have mutually different refractive indices N1 to Nn and the branch fiber portions 42c have mutually different optical distances D1 to Dn. With this configuration, the laser apparatus 200 controls the waveform of the final output laser beam L' with a high level of accuracy.

Next, a second modification of the above-described embodiment will be described with reference to FIGS. 8A and 8B. Similar to the first modification, in FIGS. 8A and 8B, the elements which are essentially the same as corresponding elements of the laser apparatus 200 illustrated in FIG. 1 are designated by the same reference signs and a description thereof is omitted.

In the second modification, as illustrated in FIG. 8A, the oscillating condition control unit 92 includes first through n-th seed LD control units 921 to 92n which are configured to control the waveforms of the laser light emitted by the seed lasers L1 to Ln (the laser elements 21).

Further, in the second modification, as illustrated in FIG. 8B, the coupling fiber 42 includes the joint fiber portion 42b and a plurality of branch fiber portions 42d which are set up to have the physical lengths d1 to dn and the refractive indices N1 to Nn, respectively.

In the second modification, the physical lengths d1 to dn and the refractive indices N1 to Nn of the branch fiber portions 42d are determined, respectively, so that the optical distances D1 to Dn of the branch fiber portions 42d are different from one another.

The first through n-th seed LD control units 921 to 92n operate independently of each other. However, each control unit has the same function. In the following, the first seed LD control unit 921 is taken as a representative one, and a function of the first seed LD control unit 921 is explained.

The first seed LD control unit 921 serves as an arbitrary waveform generator to set up a pulse width T1 of the seed laser L1 and a pulse height value I1 of the seed laser L1. FIG. 9A illustrates a pulsed waveform of the laser light ray emitted from the seed laser L1 to the incidence end portion 43 in FIG. 8A.

As illustrated in FIG. 9A, the pulse width T1 denotes a time difference between two time points at which the pulse height value I is equal to half of the maximum pulse height value, which is called a half width.

Each of the second through n-th seed LD control units 922 to 92n has the same function as that of the first seed LD control unit 921. FIG. 9B illustrates a pulsed waveform of the laser light ray emitted from the seed laser Ln to the incidence end portion 43 in FIG. 8A.

A control operation of the first through n-th seed LD control units 921 to 92n to control the seed lasers L1 to Ln is explained.

When combining the laser light of the seed lasers L1 and Ln, the seed lasers L1 and Ln are controlled by the first and n-th seed LD control units 921 and 92n to emit the laser light rays having the pulsed waveforms as illustrated in FIGS. 9A and 9B, respectively.

When the laser light of the seed lasers L1 and Ln passes through the branch fiber portions 42d, the laser light rays emitted from the seed lasers L1 and Ln pass through the different optical distances D1 and Dn, respectively. Hence, the times t1 and tn needed for the laser light of the seed lasers L1 and Ln to pass through the branch fiber portions 42d are in proportion to the optical distances D1 and Dn, respectively, and the laser light of the seed lasers L1 and Ln at the time of outputting from the emission end portion 44 to the optical amplification section 3 has the waveform as illustrated in FIG. 9C.

In this way, the branch fiber portions 42d are configured to have mutually different refractive indices N1 to Nn, and the branch fiber portions 42d have mutually different optical distances D1 to Dn so as to delay the laser light of the seed lasers L1 to Ln from the reference time t0, in order to determine the waveform of the combined laser light of the seed lasers L1 to Ln. In other words, the pulse delays t1 to tn of the seed lasers L1 to Ln are determined according to the optical distances D1 to Dn of the branch fiber portions 42d.

In the second modification, the oscillating condition control unit 92 includes the first through n-th seed LD control units 921 to 92n which are configured to control the waveforms of the laser light rays emitted from the seed lasers L1 to Ln independently of each other.

With this configuration, the profile of the pulsed waveform of the seed laser L can be set up suitably, and the laser apparatus 200 is capable of outputting the laser beam L' suitably while controlling the pulse delay at a high level of accuracy.

The present disclosure is not limited to the above-described embodiments, but various variations and modifications may be made without departing from the scope of the present disclosure.

For example, the laser apparatus 200 in the above-described embodiment may be applied to a pulsed laser machining device utilized for metalworking, and may be applied to a medical apparatus, such as a laser surgical unit. Further, the laser apparatus 200 may be applied to various devices, including a spectrometer, an analytical device, a sensing device, and a LIDAR (laser imaging detection and ranging) device.

Next, an example in which the laser apparatus 200 is applied to a laser machining device will be described with reference to FIG. 11. In FIG. 11, the elements which are essentially the same as corresponding elements in the above-described embodiment are designated by the same reference signs and a description thereof is omitted.

As illustrated in FIG. 11, a laser machining device 700 includes a laser output section 10 in which the laser apparatus 200 is disposed, a laser scanning section 11, a work transport section 12, and the control unit 9. The laser machining device 700 further includes a plurality of reflection mirrors 16, 17, and 18 configured to form an optical path of the laser beam L' output from the laser output section 10, and a focusing lens (fθ lens) 28 configured to convert the laser beam L' from the reflection mirror 18 into a focusing laser beam at an emission position Q.

The laser output section 10 includes the laser apparatus 200 and a beam expander 14 configured to change the diameter of the laser beam L' output from the laser apparatus 200.

The laser scanning section 11 is implemented by a scanning unit which is supported to be movable on an XY plane by using a main-scanning direct-acting stage 27 and a sub-scanning direct-acting stage 26 (which will be described later) and configured to move the emission position Q of the laser beam L' output from the laser output section 10 on the XY plane. The laser scanning section 11 includes a diffraction optical element 19 disposed at an end portion on the incident side of the laser beam L'.

The diffraction optical element 19 is configured to convert an intensity distribution and a spot profile of the laser beam L' at an image formation position, and is capable of setting up the top hat distribution and the rectangular shape of the laser beam L' arbitrarily.

The laser scanning section 11 is supported by a carriage 25 mounted on the main-scanning direct-acting stage 27, so that the laser scanning section 11 is movable in a main scanning direction that is the X-axis direction. The main-scanning direct-acting stage 27 is supported by the sub-scanning direct-acting stage 26, so that the main-scanning direct-acting stage 27 is movable in a sub-scanning direction that is the Y-axis direction.

The work transport section 12 is implemented by a pair of transport rollers, and these transport rollers are configured to transport a work 35 (target object) while sandwiching the work 35 between the transport rollers. The control unit 9 is configured to control the light source section 2 to perform the pulsed oscillation of the seed lasers L1 to Ln independently of each other.

Next, a laser machining method for machining the work 35 (target object) by the above-described laser machining device 700 will be described with reference to FIG. 12.

The control unit 9 controls the light source section 2 to perform the pulsed oscillation of the seed lasers L1 to Ln independently of each other. As previously described with reference to FIG. 1, the optical amplification section 3 combines the laser light from the seed lasers L1 to Ln as the laser beam L', and the laser output section 10 outputs the combined laser light as the laser beam L' (step S101). The step S101 is a step of combining the laser light from the seed lasers L1 to Ln which are controlled to perform the pulsed oscillation independently of each other, and outputting the combined laser light as the laser beam L'.

The laser beam L' output from the laser output section 10 is reflected by the reflection mirror 16 fixed to the laser output section 10, and reflected by the reflection mirror 17 on the main-scanning direct-acting stage 27, and further reflected by the reflection mirror 18 fixed to the laser scanning section 11, and then enters the fθ lens 28 (step S102).

The fθ lens 28 converts the incoming laser beam L' into the focusing laser beam L', and the laser machining device 700 emits the focusing laser beam L' to the work 35 at the emission position Q on the work 35 (step S103). The step S103 is a step of machining the work 35 by the focusing laser beam.

The emission position Q may be changed to another position by moving the laser scanning section 11 on the XY plane according to the type of machining on the work 35.

By applying the laser apparatus 200 to the laser machining device 700, it is possible for the laser machining device 700 to perform the laser machining process based on machining conditions suitable for the type of the work 35 being machined or for each machining portion. Further, it is possible for the laser machining device 700 to perform the laser machining process based on complicated machining conditions, such as machining conditions in which a non-heating process and a heating process are combined.

For example, in metalworking, it is possible for the laser machining device 700 to form dimples on the work 35 in the non-heating process (e.g., a laser ablation process) by performing the short pulsed oscillation, and smooth the dimpled surface of the work 35 in the heating process (e.g., a melting process) by performing the continuous oscillation.

In this embodiment, the control unit 9 is configured to control the seed lasers L1 to Ln to perform the pulsed oscillation. Alternatively, the control unit 9 may be configured to control at least one of the seed lasers L1 to Ln to perform the continuous oscillation (DC oscillation), instead of the pulsed oscillation.

All examples and conditions described in the foregoing are to be construed as being without limitation to such specifically recited examples and conditions, nor does the organization of such examples in the specification relate to a showing of superiority or inferiority of the invention.

The present application is based upon and claims the benefit of priority of Japanese Patent Application No. 2015-229113, filed on Nov. 24, 2015, and Japanese Patent Application No. 2016-181687, filed on Sep. 16, 2016, the contents of which are incorporated herein by reference in their entirety.

REFERENCE SIGNS LIST 2 light source section
3 optical amplification section
9 control unit
21 emission point (laser element)
31 incidence surface
32 emission surface
35 work (target object)
42a light-guiding path (branch fiber portion)

42b light-guiding path (joint fiber portion)
42c light-guiding path (branch fiber portion)
42d light-guiding path (branch fiber portion)
43 incidence end portion
44 emission end portion
92 oscillating condition control unit
93 amplification condition control unit
d1 to dn physical lengths
L1 to Ln seed lasers
L' laser beam
N1 to Nn refractive indices
200 laser beam generation apparatus (laser apparatus)
700 laser machining device
S101 combining step
S103 machining step

The invention claimed is:

1. A laser beam generation apparatus, comprising:
a light source including a plurality of seed lasers each emitting laser light;
an optical amplifier that includes an incidence surface and an emission surface, the optical amplifier disposed to face the seed lasers of the light source, and the optical amplifier amplifying the laser light emitted from the seed lasers and received at the incidence surface to output amplified laser light from the emission surface; and
a plurality of light-guiding paths, each light-guiding path guiding the laser light emitted by a corresponding seed laser of the plurality of seed lasers to enter the incidence surface of the optical amplifier, wherein
at least one light-guiding path of the plurality of light-guiding paths has an optical distance different from an optical distance of another light-guiding path of the plurality of light-guiding paths, and
the optical amplifier combines the laser light from the plurality of light-guiding paths and outputs combined laser light as a laser beam.

2. The laser beam generation apparatus according to claim 1, wherein the optical amplifier comprises a plurality of optical amplifiers which are connected in series.

3. The laser beam generation apparatus according to claim 1, wherein the light source further includes a plurality of surface emitting lasers which are arrayed in a two-dimensional formation on a surface perpendicular to a direction of an optical axis of the laser light.

4. The laser beam generation apparatus according to claim 1, wherein the plurality of light-guiding paths traverse optical fibers.

5. The laser beam generation apparatus according to claim 4, wherein the optical fibers have mutually different refractive indices and the plurality of light-guiding paths have mutually different optical distances.

6. The laser beam generation apparatus according to claim 4, wherein the optical fibers to have mutually different physical lengths and the plurality of light-guiding paths have mutually different optical distances.

7. A laser machining device, comprising:
a laser beam generation apparatus including:
a light source including a plurality of seed lasers each emitting laser light;
an optical amplifier that includes an incidence surface and an emission surface, the optical amplifier disposed to face the seed lasers of the light source, and the optical amplifier amplifying the laser light emitted from the seed lasers and received at the incidence surface to output amplified laser light from the emission surface; and
a plurality of light-guiding paths, each light-guiding path guiding the laser light emitted by a corresponding seed laser of the plurality of seed lasers to enter the incidence surface of the optical amplifier, wherein
at least one light-guiding path of the plurality of light-guiding paths has an optical distance different from an optical distance of another light-guiding path of the plurality of light-guiding paths,
the optical amplifier combines the laser light from the plurality of light-guiding paths and outputs combined laser light as a laser beam, and
the laser machining device machines a target object with the laser beam output from the laser beam generation apparatus.

8. A laser machining method, comprising:
combining, by an optical amplifier, laser light from a plurality of light-guiding paths having mutually different optical distances, the laser light being emitted by a plurality of seed lasers of a light source and guided by the plurality of light-guiding paths, the optical amplifier including an incidence surface and an emission surface, the optical amplifier disposed to face the seed lasers of the light source, and the optical amplifier combining and amplifying the laser light emitted from the seed lasers and received at the incidence surface;
outputting, from the emission surface of the optical amplifier, the combined laser light as a laser beam; and
machining a target object by the laser beam.

* * * * *